United States Patent
Lou

(10) Patent No.: US 9,786,864 B2
(45) Date of Patent: Oct. 10, 2017

(54) DISPLAY PANEL, DISPLAY DEVICE AND MANUFACTURING METHOD OF DISPLAY PANEL

(71) Applicants: Shanghai Tianma Micro-Electronics Co., Ltd., Shanghai (CN); Tianma Micro-Electronics Co., Ltd., Shenzhen (CN)

(72) Inventor: Junhui Lou, Shanghai (CN)

(73) Assignees: SHANGHAI TIANMA MICRO-ELECTRONICS CO., LTD, Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/966,299

(22) Filed: Dec. 11, 2015

(65) Prior Publication Data
US 2016/0181347 A1  Jun. 23, 2016

(30) Foreign Application Priority Data
Dec. 19, 2014 (CN) .......................... 2014 1 0817268

(51) Int. Cl.
*H01L 29/08* (2006.01)
*H01L 51/52* (2006.01)
*H01L 27/32* (2006.01)

(52) U.S. Cl.
CPC ............ *H01L 51/52* (2013.01); *H01L 27/326* (2013.01); *H01L 51/529* (2013.01); *H01L 27/3244* (2013.01); *H01L 51/5253* (2013.01)

(58) Field of Classification Search
CPC ... H01L 27/3244; H01L 27/326; H01L 51/52; H01L 51/5253; H01L 51/529
USPC ...... 257/40, 93; 349/106, 112, 143, 139, 47, 349/156, 130
See application file for complete search history.

(56) References Cited

U.S. PATENT DOCUMENTS

| | | | |
|---|---|---|---|
| 6,270,250 B1 | 8/2001 | Song | |
| 2007/0002242 A1* | 1/2007 | Ogata | G02F 1/1309 349/139 |
| 2007/0177094 A1* | 8/2007 | Van Dam | G09F 9/30 349/156 |
| 2008/0218369 A1* | 9/2008 | Krans | A47G 9/1045 340/691.1 |
| 2011/0013126 A1* | 1/2011 | Wang | G02F 1/133555 349/106 |
| 2011/0141425 A1* | 6/2011 | Moriya | G02F 1/13394 349/143 |
| 2015/0241724 A1* | 8/2015 | Okabe | G02F 1/13454 349/47 |

(Continued)

FOREIGN PATENT DOCUMENTS

| | | |
|---|---|---|
| CN | 1934603 A | 3/2007 |
| CN | 101505657 A | 8/2009 |
| JP | 4225623 B2 | 2/2009 |

*Primary Examiner* — Mohammed Shamsuzzaman
(74) *Attorney, Agent, or Firm* — Faegre Baker Daniels LLP

(57) ABSTRACT

A display panel, a display device and a manufacturing method of the display panel. The display panel includes a display area and a non-display area, the display area includes a plurality of pixel areas, at least one through hole is arranged in at least one of the plurality of pixel areas, and the through hole passes through the display panel along the thickness direction of the display panel.

18 Claims, 15 Drawing Sheets

(56) References Cited

U.S. PATENT DOCUMENTS

| | | | |
|---|---|---|---|
| 2015/0301377 A1* | 10/2015 | Lee ................... | G02F 1/133377 349/43 |
| 2016/0116646 A1* | 4/2016 | Araki .................. | G02B 6/0051 349/112 |
| 2016/0190389 A1* | 6/2016 | Lee .................... | H01L 51/5256 257/93 |
| 2016/0202516 A1* | 7/2016 | Watanabe ............. | G02F 1/1339 349/130 |

* cited by examiner

DISPLAY PANEL, DISPLAY DEVICE AND MANUFACTURING METHOD OF DISPLAY PANEL

CROSS-REFERENCE TO RELATED APPLICATION

This application claims priority to Chinese Application No. 201410817268.4, filed Dec. 19, 2014, which is herein incorporated by reference in its entirety.

TECHNICAL FIELD

The present disclosure relates to display technologies and, in particular, to a display panel, a display device including the display panel and a manufacturing method of the display panel.

BACKGROUND

With the development of display technology, some wearable display devices with flexible display panels have emerged, so that people can wear the wearable display devices on hands and the like by taking advantage of the flexibility of the display panels. This makes it convenient for people to carry and use the display devices. Currently, the wearable display devices are drawing more and more attention from people, and exhibiting significant application potential in fields such as entertainment.

However, the wearable display devices are completely non-breathable in the related art, and when people wear the wearable display devices, heat, sweat and the like at the contact sites between the wearable display devices and human bodies cannot be dissipated, which not only affects the normal operation of the wearable display devices, but also brings discomfort to the human bodies.

SUMMARY

In view of this, in a first example, embodiments of the disclosure provide a display panel including a display area and a non-display area, wherein the display area includes a plurality of pixel areas, at least one through hole is disposed in at least one of the plurality of pixel areas, and the through hole passes through the display panel along the thickness direction of the display panel.

In a second example, embodiments of the disclosure provide a display device including the display panel described in the above-mentioned first example.

In a third example, embodiments of the disclosure provide a manufacturing method of a display panel, and the method includes:

providing a display panel, wherein the display panel includes a display area and a non-display area, and the display area includes a plurality of pixel areas; and forming at least one through hole in at least one of the plurality of pixel area, wherein the through hole passes through the display panel along the thickness direction of the display panel.

With the display panel, the display device and the manufacturing method of the display panel, according to embodiments of the disclosure, a few of the pixel areas in the display area of the display panel are sacrificed, and each one of the sacrificed pixel areas is provided with at least one through hole penetrating through the display panel along the thickness direction of the display panel, such that the display panel is breathable due to the through hole without affecting the display effect of the display; when the above-mentioned display panel is adopted in the display device, the display device is breathable accordingly.

While multiple embodiments are disclosed, still other embodiments of the disclosure will become apparent to those skilled in the art from the following detailed description, which shows and describes illustrative embodiments of the disclosure. Accordingly, the drawings and detailed description are to be regarded as illustrative in nature and not restrictive.

BRIEF DESCRIPTION OF THE DRAWINGS

With the detailed non-limiting embodiments described below with reference to accompanying drawings, other features, purposes and advantages of the disclosure will become more apparent.

Figure 1:
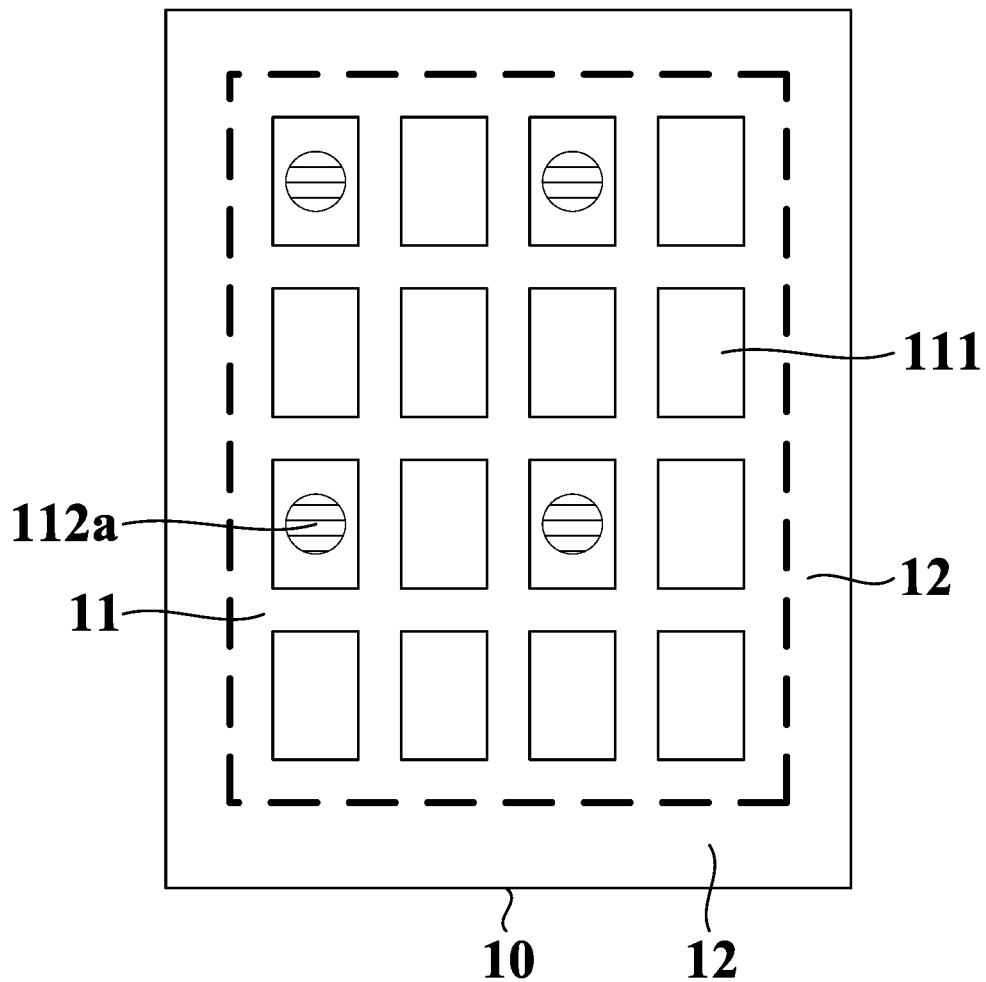
FIG. 1 is a schematic diagram showing a structure of a display panel, according to embodiments of the disclosure.

While the disclosure is amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The disclosure will be described below further in detail with reference to the accompanying drawings and the embodiments. It is appreciated that the specific embodiments described herein are used to explain the disclosure, rather than limiting the disclosure. It is further noted that merely a part and not the whole content of the disclosure is shown in the accompanying drawings, for the sake of description.

Embodiments of the disclosure provide a display panel. FIG. 1 is a schematic diagram of a structure of a display panel, according to embodiments of the disclosure. As shown in FIG. 1, the display panel 10 includes a display area 11 and a non-display area 12, where the display area 11 includes a plurality of pixel areas 111, at least one through hole 112a is disposed in at least one pixel area 111, and the through hole 112a passes through the display panel 10 along the thickness direction of the display panel 10 (i.e. a direction perpendicular to the paper of FIG. 1).

It is noted that through holes 112a are disposed in four pixel areas 111 as shown in FIG. 1, which is merely an example in the embodiments of the disclosure, and the through holes can be disposed in one, two, three, five or more pixel areas in other examples. In actual design, the through holes can be disposed in the pixel areas of as many as possible, as long as the display effect of the display pane is not affected by the pixel areas with the through holes, so as to ensure a better breathability of the display panel.

Since an area occupied by the display area 11 is much larger than an area occupied by the non-display panel 12 in the display panel 10, a few of the pixel areas 111 in the display area 11 can be sacrificed (i.e. provided with at least one through hole) without affecting the display effect of the display panel. Further, the through holes 112a disposed in the sacrificed pixel areas 111 extend through the display panel 10 along the thickness direction of the display panel 10, so that a better breathability of the display panel 10 is implemented by the through holes 112a.

Figure 2:
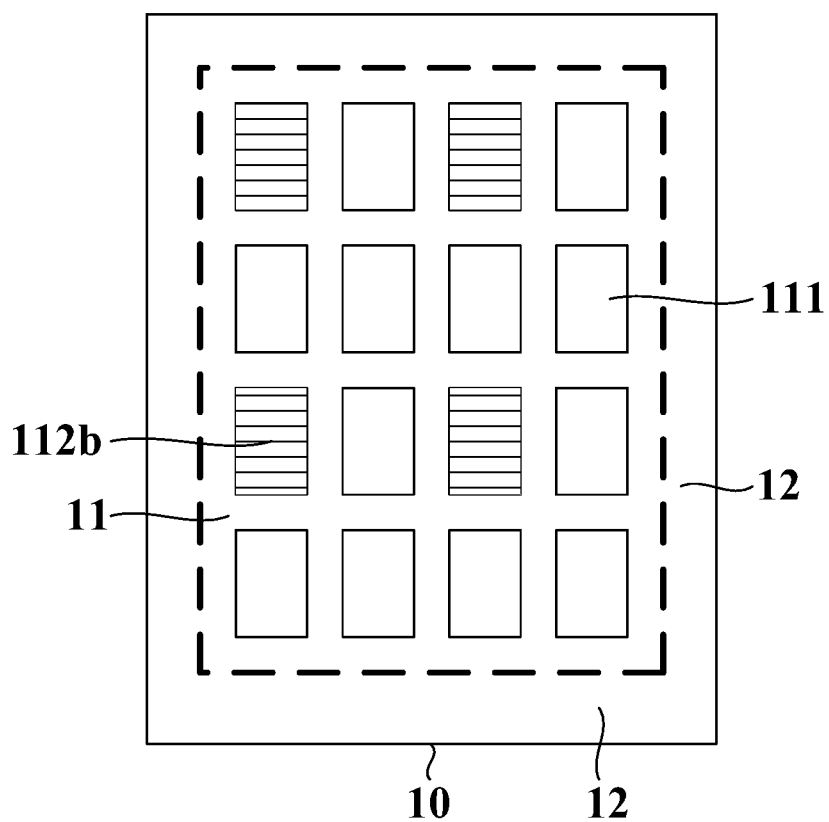
FIG. 2 is a schematic diagram showing a structure of another display panel, according to embodiments of the disclosure.

As shown in FIG. 1, each of the sacrificed pixel areas 111 is provided with one through hole 112a, and the size of the through hole 112a is smaller than that of the pixel area 111, moreover, the through hole 112a has a circle shape. This is merely an example of arranging the through hole in the pixel area. In another example, as shown in FIG. 2, one through hole 112b is disposed in each of the sacrificed pixel areas 111, but the size of the through hole 112b is equal to that of the pixel area 111, and the through hole 112b has a rectangle shape. As comparing FIG. 1 with FIG. 2, the size of the through hole 112b in FIG. 2 is larger than that of the through hole 112a in FIG. 1, in this way the breathability of the through hole 112b in FIG. 2 is better.

Figure 3:
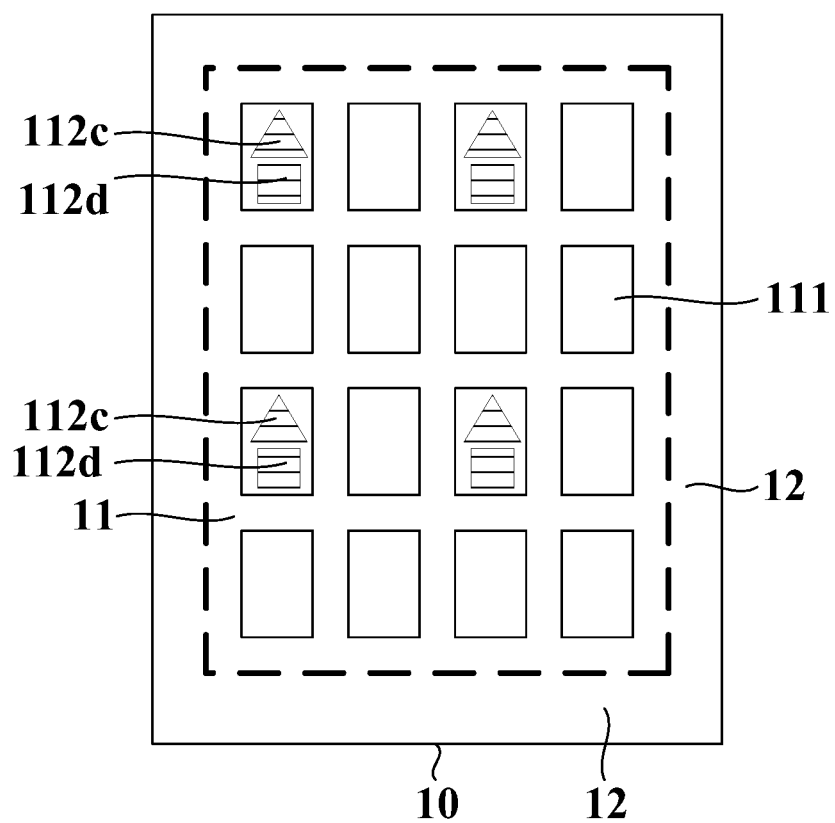
FIG. 3 is a schematic diagram showing a structure of yet another display panel, according to embodiments of the disclosure.
Figure 4:
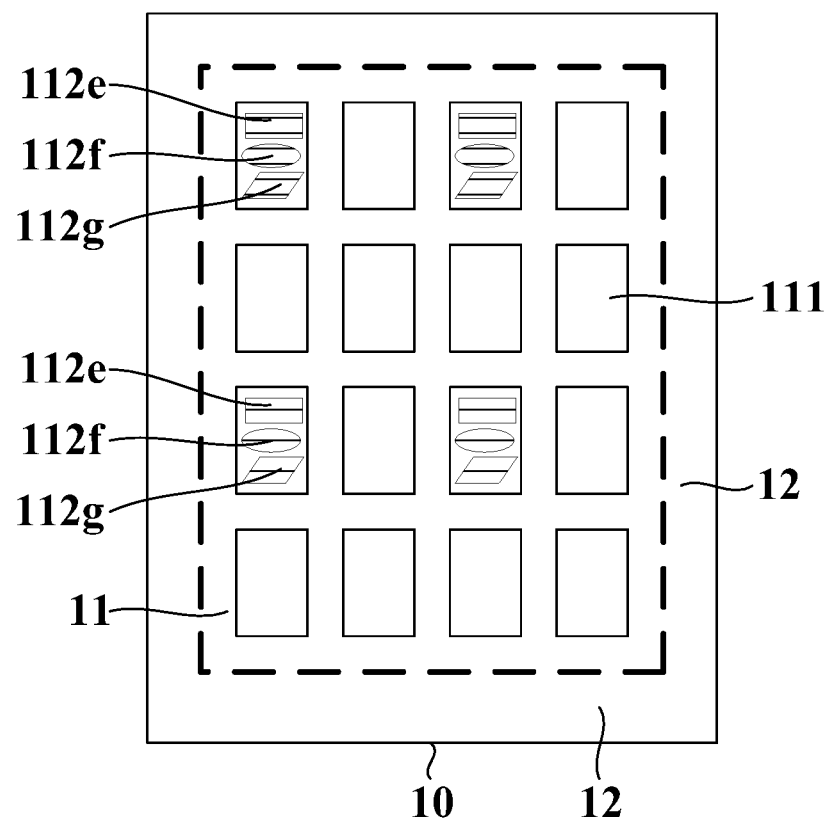
FIG. 4 is a schematic diagram showing a structure of yet another display panel, according to embodiments of the disclosure.
Figure 5:
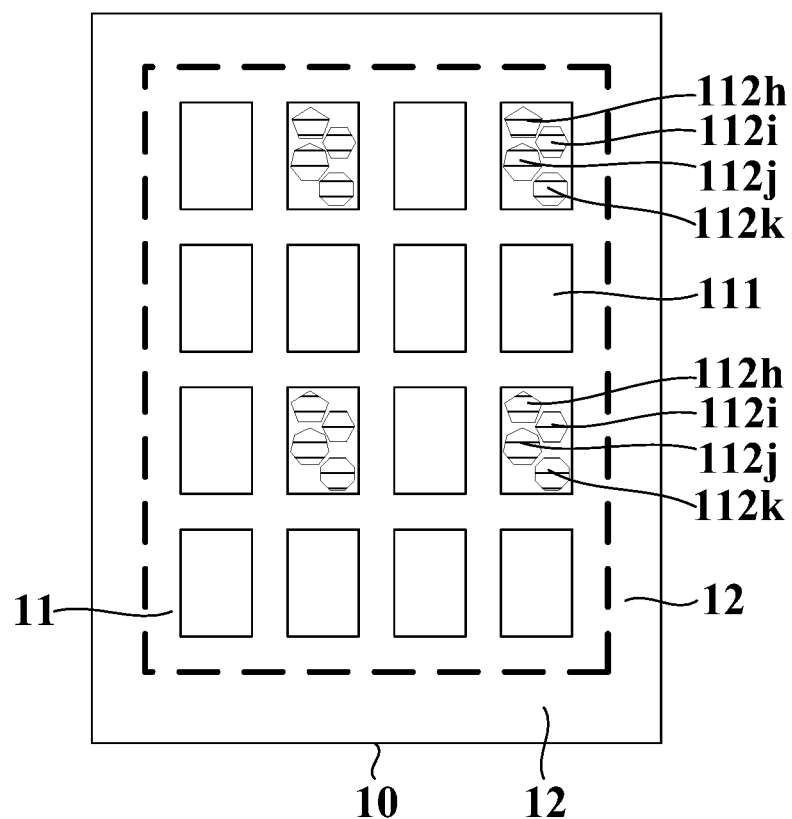
FIG. 5 is a schematic diagram showing a structure of yet another display panel, according to embodiments of the disclosure.
Figure 6:
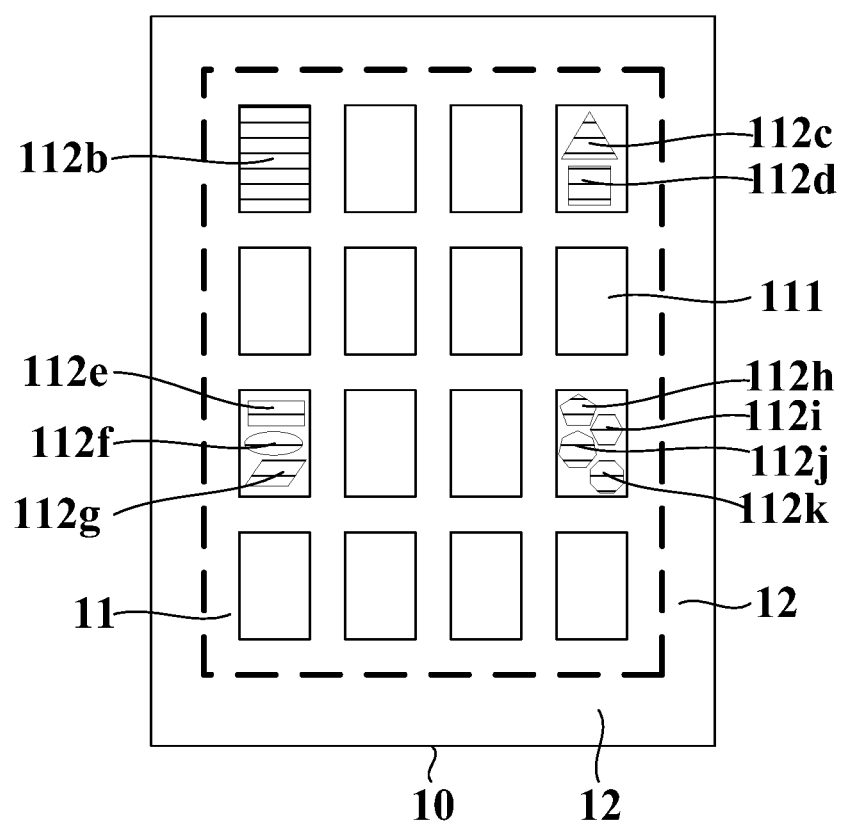
FIG. 6 is a schematic diagram showing a structure of yet another display panel, according to embodiments of the disclosure.

In FIG. 1 and FIG. 2, only one through hole (e.g. the through hole 112a as shown in FIG. 1 and the through hole 112b as shown in FIG. 2) is disposed in one of the plurality of pixel areas 111. Alternatively, a plurality of through holes can be disposed in one of the plurality of pixel areas. As shown in FIG. 3, two through holes 112c and 112d are disposed in each one of pixel areas 111 provided with the through holes, where the through hole 112c has a regular triangle shape, and the through hole 112d has a square shape; or as shown in FIG. 4, three through holes 112e, 112f and 112g are disposed in each one of pixel areas 111 provided with the through holes, where the through hole 112e has a rectangle shape, the through hole 112f has an oval shape, and the through hole 112g has a parallelogram shape; or as shown in FIG. 5, four through holes 112h, 112i, 112j and 112k are disposed in each one of pixel areas 111 provided with the through holes, where the through hole 112h has a regular pentagon shape, the through hole 112i has a regular hexagon shape, the through hole 112j has a regular heptagon shape, and the through hole 112k has a regular octagon shape; or as shown in FIG. 6, among all pixel areas 111 provided with the through holes, one of the plurality of pixel areas 111 in the first row and first column is provided with one through hole 112b, one of the plurality of pixel areas 111 in the first row and fourth column is provided with two through holes 112c and 112d, one of the plurality of pixel areas 111 in the third row and first column is provided with three through holes 112e, 112f and 112g, and one of the plurality of pixel areas 111 in the third row and fourth column is provided with four through holes 112h, 112i, 112j and 112k. It can be seen from FIG. 2 to FIG. 6 that, the through hole disposed in one of the plurality of pixel areas 111 in the first row and first column as shown in FIG. 6 is the same as the through hole disposed in one of the plurality of pixel areas 111 in FIG. 2, the through holes disposed in one of the plurality of pixel areas 111 in the first row and fourth column as shown in FIG. 6 are the same as the through holes disposed in one of the plurality of pixel areas in FIG. 3, the through holes disposed in one of the plurality of pixel areas 111 in the third row and first column as shown in FIG. 6 are the same as the through holes disposed in one of the plurality of pixel areas 111 in FIG. 4, and the through holes disposed in one of the plurality of pixel areas 111 in the third row and fourth column as shown in FIG. 6 are the same as the through holes disposed in one of the plurality of pixel areas 111 in FIG. 5.

Although some examples of arranging the through holes in one of the plurality of pixel areas are given in the display panels as shown in FIG. 1 to FIG. 6, in other examples, the number and the shapes of the through holes in each one of pixel areas provided with the through holes can be selected as desired, as long as each of through holes is breathable and hence the display panel provided with the through holes is breathable. In this way, the number and the shapes of the through holes disposed in one of the plurality of pixel areas are not limited herein.

It can also be seen from the above embodiments that, given the breathability of each through hole, if the area of one through hole or the sum of the areas of a plurality of through holes approximates to the area of one of the plurality of pixel areas provided with the through hole(s), the sacrificed pixel area (i.e. the one of the plurality of pixel areas provided with the through hole) can be more effectively utilized, and moreover a better breathability of the display panel is ensured.

As shown in FIG. 1 to FIG. 5, a plurality of through holes are disposed as an array in the display panel 10. It is noted that, all of the pixel areas provided with the through holes as shown in FIG. 3 to FIG. 5 are disposed in an array, and the through holes with the same shape in the pixel areas are disposed in an array as well.

Figure 7:
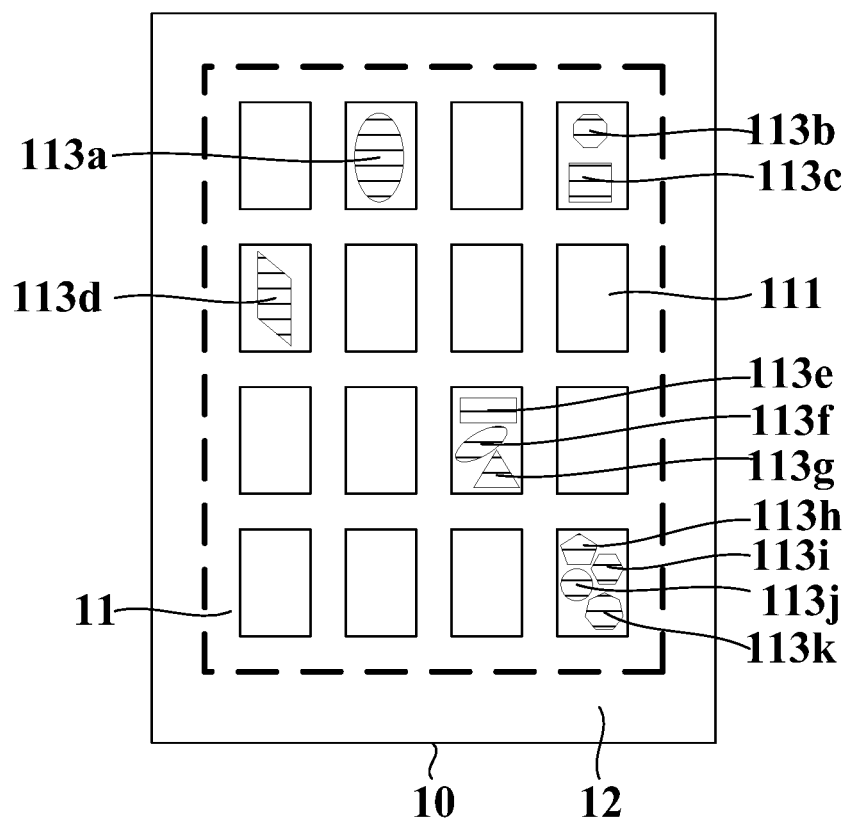
FIG. 7 is a schematic diagram showing a structure of yet another display panel, according to embodiments of the disclosure.

The above plurality of through holes are disposed as an array in the display panel 10, that is, the plurality of through holes are regularly disposed in the display panel 10. In addition, the plurality of through holes may also be irregularly disposed in the display panel 10, for example, as shown in FIG. 6, the pixel areas provided with the through holes are disposed in an array, but the through holes are irregularly disposed; or as shown in FIG. 7, among all pixel areas provided with the through holes, one of the plurality of pixel areas 111 in the first row and second column is provided with an oval through hole 113a, one of the plurality of pixel areas 111 in the first row and fourth column is provided with two through holes 113b and 113c, where the through hole 113b has a regular octagon shape and the through hole 113c has a square shape, one of the plurality of pixel areas 111 in the second row and first column is provided with a parallelogrammic through hole 113d, one of the plurality of pixel areas 111 in the third row and third column is provided with three through holes 113e, 113f and 113g, where the through hole 113e has a rectangle shape, the through hole 113f has an oval shape and the through hole 113g has a regular triangle shape, and one of the plurality of pixel areas 111 in the fourth row and fourth column is provided with four through holes 113h, 113i, 113j and 113k, where the through hole 113h has a regular pentagon shape, the through hole 113i has a regular hexagon shape, the through hole 113j has a circle shape and the through hole 113k has a regular heptagon shape. It can be also seen from FIG. 7 that, the pixel areas 111 provided with the through holes are irregularly disposed, and the through holes are irregularly disposed as well. It can be seen from the comparison between the array arrangement manner and the irregular arrangement manner of the through holes in the display panel that, the plurality of through holes disposed in the array are easier to manufacture, in this way reducing the manufacturing time and improving the manufacturing efficiency.

It is noted that, other arrangement manners can also be adopted to arrange the plurality of through holes in the display panel, in addition to the arrangement manners as shown in the above figures, as long as a breathability of the display pane is enabled by the through holes disposed in the display panel. In this way, the arrangement manner of the through holes in the display panel can be in others as well.

In embodiments of the disclosure, if the display panel is used for implementing a wearable display device, the display panel in the above embodiments is a flexible display panel. Due to the flexibility of the flexible display panel, the display effect of the flexible display panel is not affected by the deformation of the flexible display panel, and in this way the flexible display panel is adopted in the wearable display device. When the wearable display device is worn on a body, the flexible display panel is deformable according to the shape of the body part, so that the wearable display device can be well fixed on the body so as to avoid bringing discomfort to the body. Further in some embodiments, the flexible display panel may be an organic light emitting display panel or an active matrix organic light emitting display panel. In addition, the display panel in the above embodiments may also be a rigid display panel.

Figure 8:
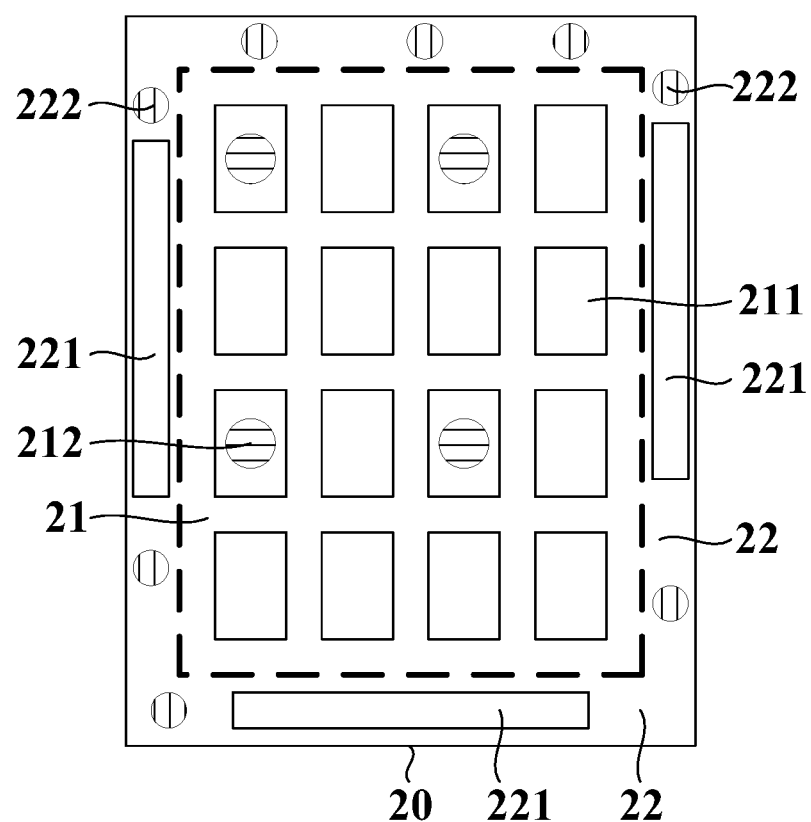
FIG. 8 is a schematic diagram showing a structure of yet another display panel, according to embodiments of the disclosure.

In the above embodiments, the through holes are described to be disposed in the display area of the display panel, but the through holes can also be disposed in the non-display area of the display panel. As shown in FIG. 8, a display panel 20 includes a display area 21 and a non-display area 22, where the display area 21 includes a plurality of pixel areas 211, at least one of which is provided with at least one through hole 212, the non-display area 22 includes a peripheral circuit 221 of the display panel 20, and at least one through hole 222 is further disposed in a position where no peripheral circuit 221 is disposed in the non-display area 22, where the through hole 212 disposed in the display area 21 and the through hole 222 disposed in the non-display area 22 extend through the display panel 20 along the thickness direction of the display panel 20. The above peripheral circuit 221 includes, but is not limited to, a drive circuit, a protection circuit, a detection circuit and the like, which are used for supporting the normal work of the display panel 20.

It is noted that, in addition to arranging the through holes in the display area, through holes are disposed in a position where no peripheral circuit is disposed in the non-display area as well in a specific example shown in FIG. 8, and the number, the sizes, the arrangement, the shapes and the like of the through holes disposed in the non-display area are selected according to requirement or design and are not limited herein.

Figure 9:
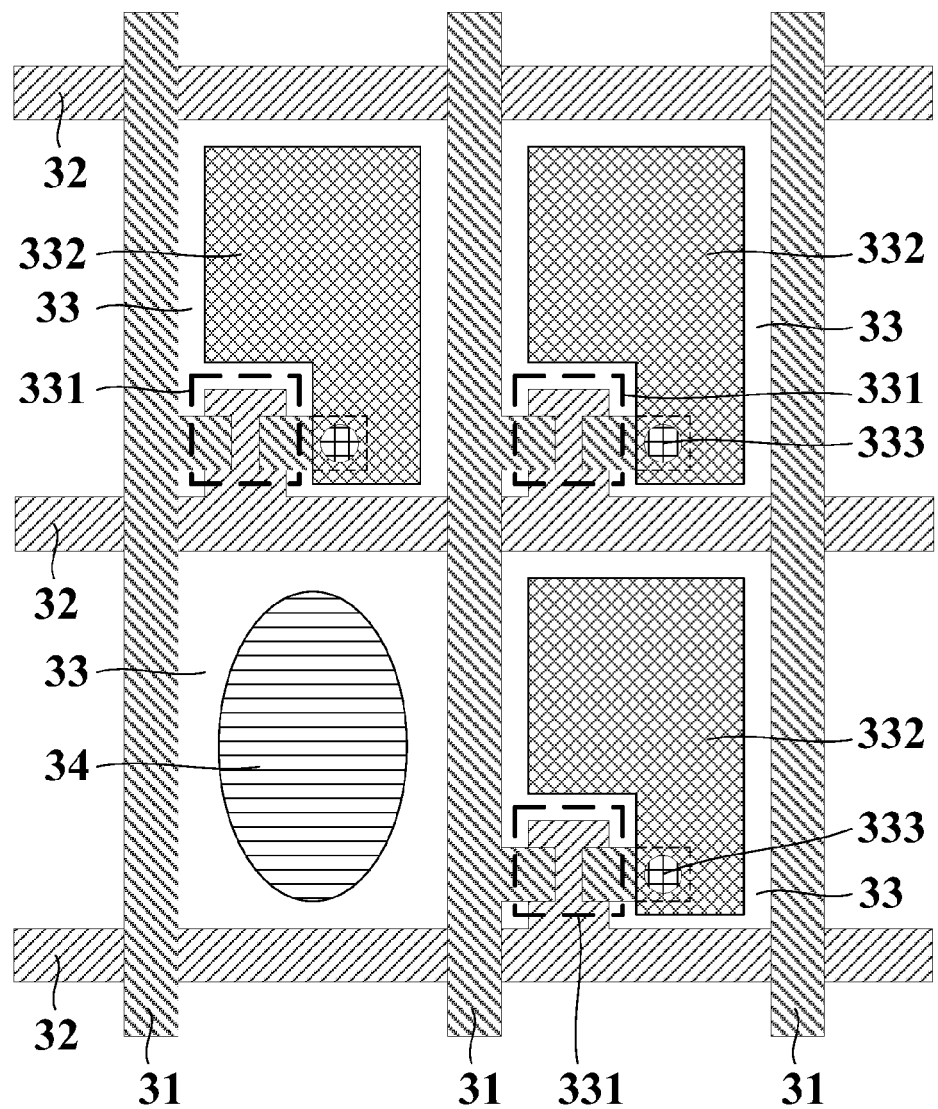
FIG. 9 is a schematic diagram showing a structure of a pixel area in a display panel, according to embodiments of the disclosure.

In the above embodiments, the through holes disposed in the pixel areas are described with respect to the display panel. The arrangement of the through holes will be further described with respect to the pixel areas disposed in the display panel. FIG. 9 is a schematic diagram showing a structure of one of the plurality of pixel areas in a display panel, according to embodiments of the disclosure. As shown in FIG. 9, the display panel includes a plurality of data lines 31, a plurality of scanning lines 32, a plurality of pixel areas 33 defined by intersecting the plurality of data lines 31 with the plurality of scanning lines 32 which are electrically insulated from the plurality of data lines 31, a plurality of thin film transistors 331 and a plurality of pixel electrodes 332, where the thin film transistors 331 and the pixel electrodes 332 are disposed in the pixel areas 33 without through hole 34, and the thin film transistors 331 are electrically connected with the pixel electrodes 332 through via holes 333, that is, the thin film transistors 331 and the pixel electrodes 332 are not disposed in the pixel areas 33 containing the through holes 34. Herein, the pixel areas 33 in which the through holes are disposed are referred to as sacrificed pixel areas, namely, the sacrificed pixel areas are not used for a display function of the display panel anymore, in this way the pixel electrodes 332 are not required in the sacrificed pixel areas. Furthermore, no thin film transistor 331 is disposed in the sacrificed pixel areas, thereby reducing the risk of a short circuit in the display panel when the through holes are drilled.

Figure 10:
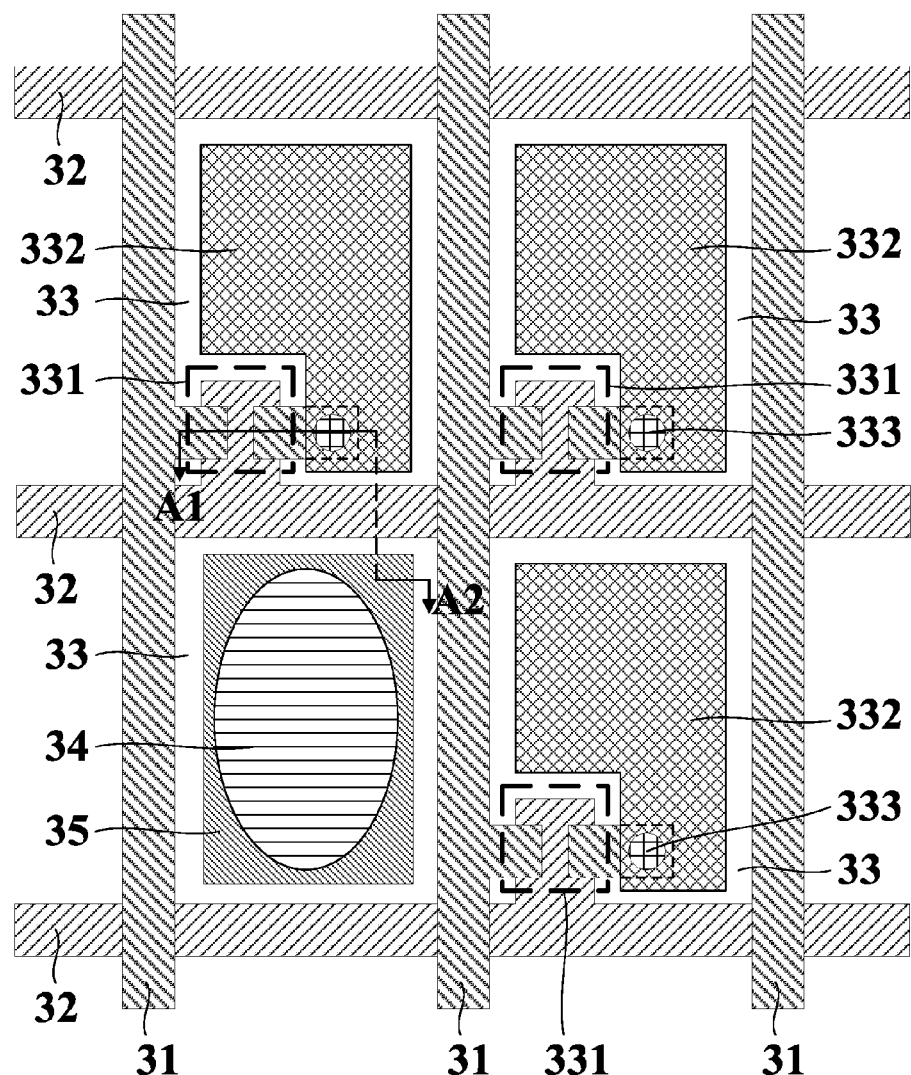
FIG. 10 is a schematic diagram showing a structure of a pixel area in another display panel, according to embodiments of the disclosure.

The through holes in the display panel may be formed by means of laser drilling. In this way, in order to facilitate the absorption of laser during the drilling, as shown in FIG. 10 the display panel may further include a metal layer 35 which is based on the structure as shown in FIG. 9, where the metal layer 35 is disposed in a position of the through hole 34 of the display panel, and the through hole 34 passes through the metal layer 35. With the metal layer 35 disposed in the position where the through holes 34 disposed, the laser is absorbed by the metal layer 35, and hence the temperature of the metal layer 35 is raised to accelerate melting of the material in the position where the through holes 34 is to be formed when the display panel is being drilled, thereby accelerating the forming of the through holes 34 and improving the manufacture efficiency of the through holes 34.

Figure 11A:
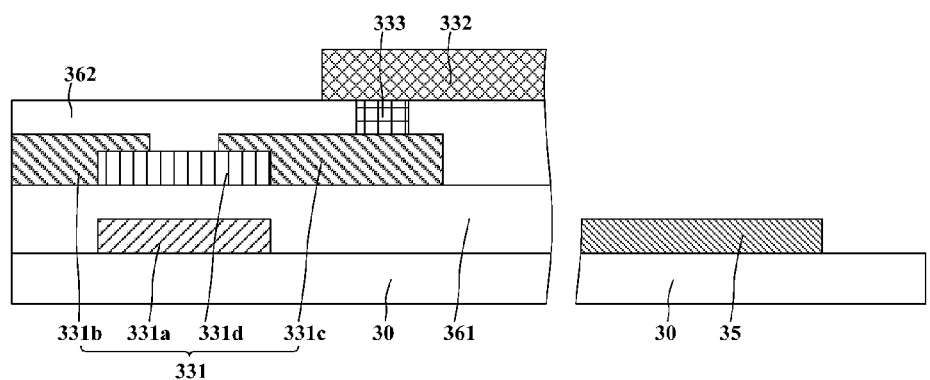
FIG. 11A is a schematic sectional diagram showing the structure of a pixel area, which is taken along A1-A2 in FIG. 10.

The above metal layer 35 may be formed in the same layer as other electrode layers of the display panel in manufacturing the display panel. FIG. 11A is a schematic sectional diagram showing the structure of one of the plurality of pixel areas, which is taken along A1-A2 in FIG. 10, the display panel includes a substrate 30; a gate 331a (a layer where the gate 331a is disposed is a gate layer) of a thin film transistor 331 disposed on the substrate 30; a first insulating layer 361 covering the gate layer 331a; a source 331b and a drain 331c (the source 331b and the drain 331c are disposed on the same layer, and a layer where the source 331b and the drain 331c are disposed is a source and drain layer) of the thin film transistor 331 disposed on the first insulating layer 361; an active layer 331d of the thin film transistor 331 between the source 331b and the drain 331c, where the source 331b and the drain 331c are electrically connected with each other through the active layer 331d; a second insulating layer 362 covering the source electrode 331b, the drain electrode 331c and the active layer 331d; and a pixel electrode 332 disposed on the second insulating layer 362, where the pixel electrode 332 is electrically connected with the drain electrode 331c of the thin film transistor 331 through a via hole 333 disposed in the second insulating layer 362. As shown in FIG. 11A, the metal layer 35 is disposed in the same layer as the gate 331a of the thin film transistor 331, namely, the metal layer 35 and the gate layer are disposed in the same layer. The metal layer 35 may be formed simultaneously with the gate 331a, thereby not only reducing the manufacturing steps of the display panel, but also reducing the production cost.

Figure 11B:
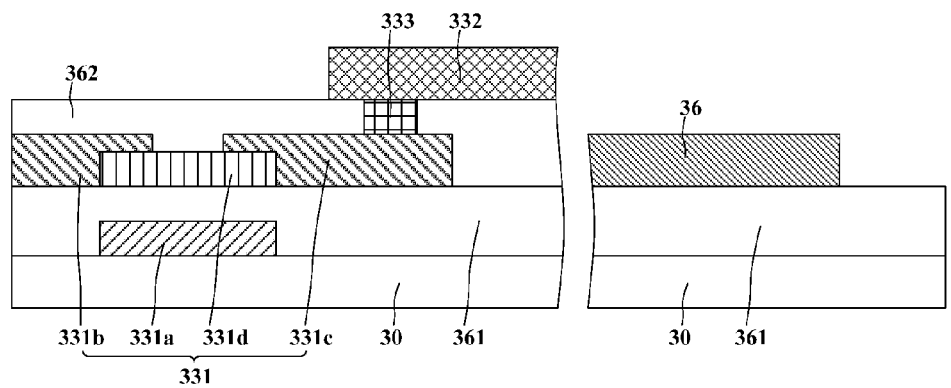
FIG. 11B is a schematic sectional diagram showing another structure of a pixel area, which is taken along A1-A2 in FIG. 10.

FIG. 11B is a schematic sectional diagram showing another structure of one of the plurality of pixel areas, which is taken along A1-A2 in FIG. 10, a metal layer 36 can also be disposed in the same layer as the source electrode 331b and the drain electrode 331c of the thin film transistor 331, namely, the metal layer 36, the source and drain layer are disposed in the same layer. In some embodiments, the metal layer 36 may be formed simultaneously with the source electrode 331b and the drain electrode 331c, thereby not only reducing the manufacturing steps of the display panel, but also reducing the production cost.

Figure 12:
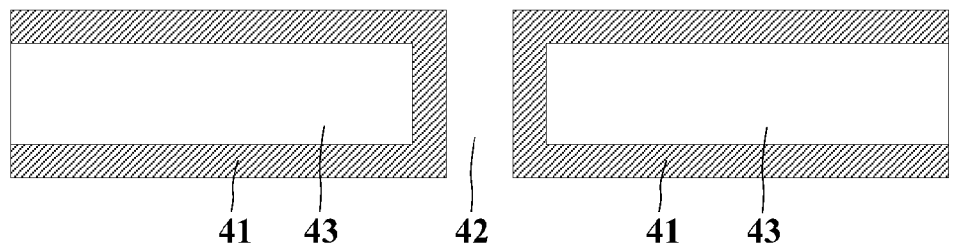
FIG. 12 is a schematic diagram showing a structure in which an isolation layer is disposed in a display panel, according to embodiments of the disclosure.

After the through holes are disposed in the display panel, substances such as water and oxygen outside the display panel might enter the display panel through the inner walls of the through holes and affect the display performance of the display panel. In view of this, in embodiments, as shown in FIG. 12, the display panel can further include an isolation layer 41 which is formed on the inner walls of through holes 42 and a display area 43 between the through holes 42. It is noted that, the thickness of the isolation layer 41 is smaller than the size of each through hole 42, so as to prevent affecting the breathability of the through holes 42 by the isolation layer 41. With the isolation layer 41 disposed in the display panel, substances such as water and oxygen outside the display panel cannot enter the display panel through the interiors of the through holes 42, to ensure the display effect of the display panel.

Further, as shown in FIG. 12, the isolation layer 41 is required to be made of a transparent material, in order to avoid affecting the display effect of the display panel, because the isolation layer 41 also covers the display area 43 of the display panel. The transparent material may be an inorganic matter, an organic matter or an inorganic-organic compound, where the inorganic matter can be silicon nitride, and the organic matter can be polyimide. The isolation layer 41 may be formed by physical vapor deposition (PVD) or chemical vapor deposition (CVD).

Figure 13:
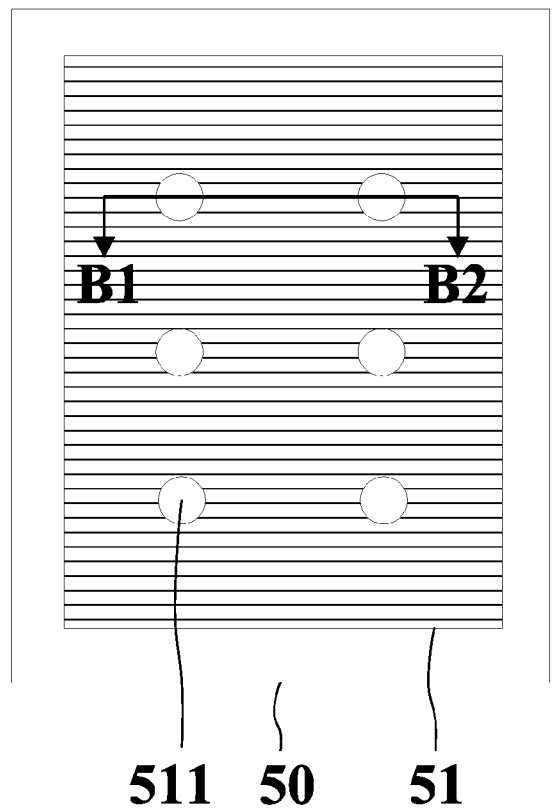
FIG. 13 is a schematic diagram showing a structure of a display device, according to embodiments of the disclosure.

Embodiments of the disclosure provide a display device. FIG. 13 is a schematic diagram showing a structure of a display device, according to embodiments of the disclosure. As shown in FIG. 13, the display device 50 includes a display panel 51 provided with through holes 511, and may further include other components configured to support the normal work of the display panel 51, where the display panel 51 refer to the display panel in the above embodiments.

Figure 14:
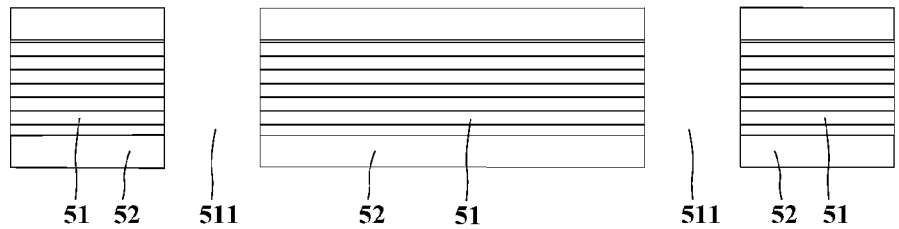
FIG. 14 is a schematic sectional diagram showing a structure of a pixel area, which is taken along B1-B2 in FIG. 13.

The surface of the display panel is generally coated by a protection film in some display devices for the purpose of protection. In order to ensure that the breathability of the display device adopting the display panel is enabled by the through holes disposed in the display panel, as shown in FIG. 14, the display device 50 further includes a protection film 52 adhered on the external surface of the display panel 51, and the through holes 511 passes through the protection film 52, in this way, the breathability of the display device 50 with the protection film 52 is achieved by the through holes 511.

In this way, when the above display device refers to a wearable display device, the wearable display device is breathable since the display panel provided with the through holes is adopted, correspondingly, heat, sweat and the like at the contact sites between the wearable display device and a human body are dissipated easily, in this way not only the normal work of the wearable display devices is ensured, but also discomfort to the human body is avoided when wearing the wearable display device.

Figure 15:
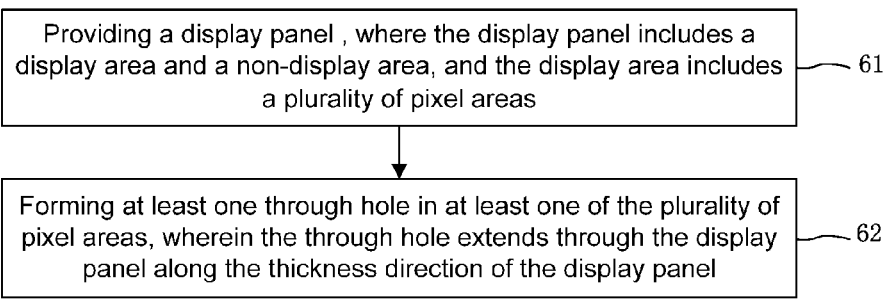
FIG. 15 is a flowchart of a manufacturing method of a display panel, according to embodiments of the disclosure.

Embodiments of the disclosure further provide a manufacturing method of a display panel. FIG. 15 is a flowchart of a manufacturing method of a display panel, according to embodiments of the disclosure. As shown in FIG. 15, the manufacturing method of the display panel includes following Steps 61 and 62.

At Step 61, a display panel is provided, where the display panel includes a display area and a non-display area, and the display area includes a plurality of pixel areas.

Figure 16A:
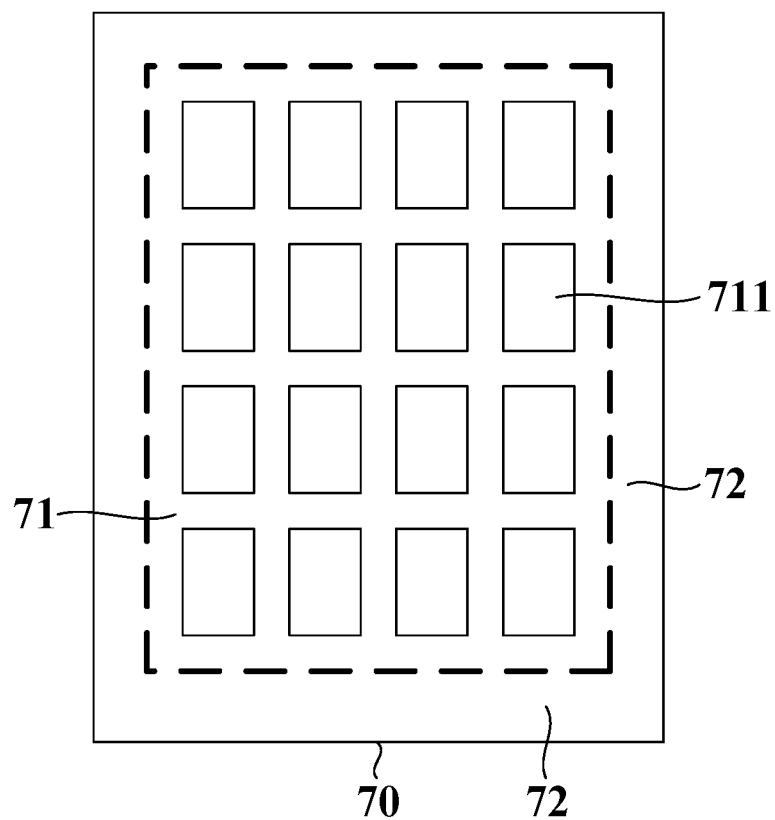
FIG. 16A and FIG. 16B are schematic diagrams showing structures corresponding to the steps of the manufacturing method of the display panel in FIG. 15, according to embodiments of the disclosure.

As shown in FIG. 16A, a display panel 70 is provided, where the display panel 70 includes a display area 71 and a non-display area 72, and the display area 71 includes a plurality of pixel areas 711.

At Step 62, at least one through hole is formed in at least one pixel area, where the through hole passes through the display panel along the thickness direction of the display panel.

Figure 16B:
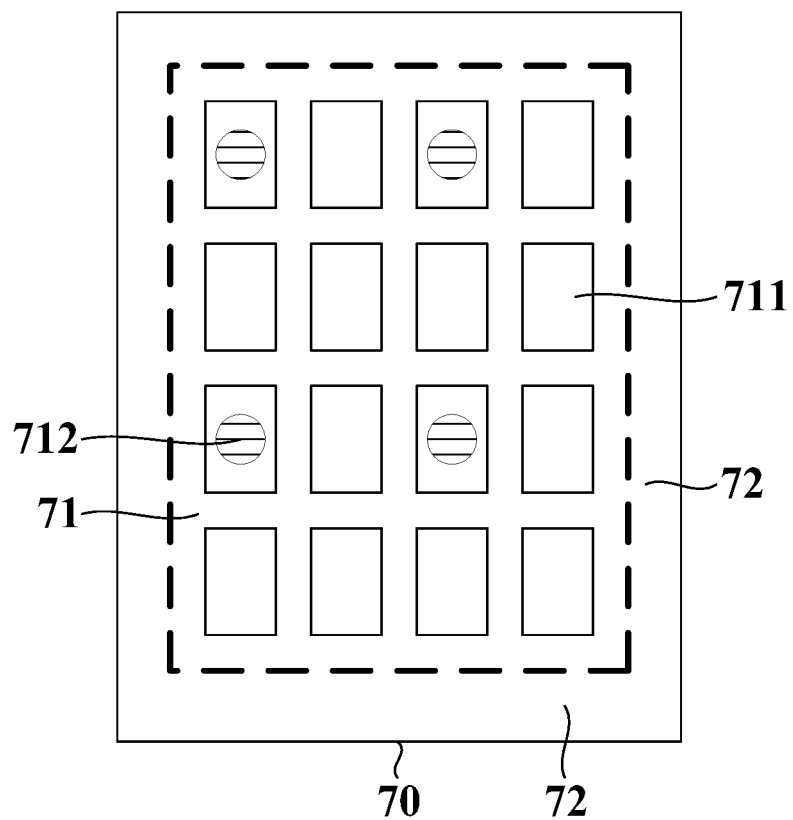

As shown in FIG. 16B, through holes 712 are disposed in four pixel areas 711 of the display area 71, where each one of pixel areas 711 is provided with a circular through hole 712 extending through the display panel 70 along the thickness direction of the display panel 70. It is noted that, FIG. 16B is an example of Step 62, and the number of the pixel areas provided with the through holes as well as the number, the sizes and the shapes of the through holes disposed in each pixel area are not limited herein.

In Step 62, the through holes may be formed by means of laser drilling to improve the drilling efficiency.

Furthermore, if the through holes are formed by means of laser drilling, a metal layer can be formed in advance in the position to be drilled by laser in the display panel, so that the metal layer may absorb the laser to form the through holes extending through the metal layer. Since the metal layer absorbs the laser during the laser drilling, the temperature of the metal layer is raised so that melting of the material in the position to be drilled by the laser is accelerated, thereby accelerating the forming of the through holes and improving the manufacture efficiency of the through holes.

With the display panel, the display device and the manufacturing method of the display panel, according to embodiments of the disclosure, a few of the pixel areas in the display area of the display panel are sacrificed, and each one of sacrificed pixel areas is provided with at least one through hole extending through the display panel along the thickness direction of the display panel, such that the display panel is breathable due to the through hole. When the display panel is utilized in the display device, the display device is hence breathable as well.

It is noted that the embodiments and the technology principles of the disclosure described as above are merely illustrative. It should be understood that the disclosure is not limited to the particular embodiments described herein. Various apparent changes, readjustments and alternatives can be made without departing from the scope of the disclosure. In this way, although the disclosure is illustrated in detail through the above embodiments, the disclosure is not limited to the above embodiments, and can further include other embodiments without departing from the scope of the disclosure.

Various modifications and additions can be made to the exemplary embodiments discussed without departing from the scope of the disclosure. For example, while the embodiments described above refer to particular features, the scope of this disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof

I claim:

1. A display panel, comprising a display area and a non-display area, wherein the display area comprises a plurality of pixel areas, one through hole is disposed in each one of some of the plurality of pixel areas, and the through hole extends through an entire thickness of the display panel from a top surface to a bottom surface of the display panel;
wherein the non-display area comprises a peripheral circuit of the display panel, and at least one through hole is further disposed in a position where no peripheral circuit is disposed in the non-display area;
a metal layer which is disposed in a position where the through hole is disposed, wherein the through hole passes through the metal layer.

2. The display panel of claim 1, wherein a size of the through hole is smaller than that of the pixel area.

3. The display panel of claim 1, wherein a plurality of through holes are disposed in one of the plurality of pixel areas.

4. The display panel of claim 3, wherein two or three through holes are disposed in one of the plurality of pixel areas.

5. The display panel of claim 1, further comprising a plurality of thin film transistors, wherein the thin film transistors are disposed in the pixel areas in which no through hole is disposed.

6. The display panel of claim 1, further comprising a gate layer, and a source and drain layer, wherein, the metal layer is disposed in the same layer as the gate layer; or the metal layer is disposed in the same layer as the source and drain layer.

7. The display panel of claim 1, further comprising an isolation layer configured to cover inner walls of the through holes and the display area between the through holes.

8. The display panel of claim 7, wherein the isolation layer comprising a transparent material.

9. The display panel of claim 1, wherein the through hole comprises a circle, oval, or polygon shape.

10. The display panel of claim 1, wherein the plurality of through holes are arranged in an array in the display panel.

11. The display panel of claim 1, wherein the display panel is a flexible display panel.

12. The display panel of claim 11, wherein the flexible display panel is an organic light emitting display panel or an active matrix organic light emitting display panel.

13. A display device, comprising a display panel, the display panel comprising a display area and a non-display area, wherein the display area comprises a plurality of pixel areas, one through hole is disposed in each one of some of the plurality of pixel areas, and the through hole extends through the entire thickness of the display panel from a top surface to a bottom surface of the display panel;
wherein the non-display area comprises a peripheral circuit of the display panel, and at least one through hole is further disposed in a position where no peripheral circuit is disposed in the non-display area;
a metal layer which is disposed in a position where the through hole is disposed, wherein the through hole passes through the metal layer.

14. The display device of claim 13, further comprising a protection film adhered on the external surface of the display panel, wherein the through hole passes through the protection film.

15. A manufacturing method of a display panel, comprising: providing a display panel, wherein the display panel comprises a display area and a non-display area, and the display area comprises a plurality of pixel areas; and
forming one through hole in each one of some of the plurality of pixel areas, wherein the through hole extends through the entire thickness of the display panel from a top surface to a bottom surface of the display panel;
wherein the non-display area comprises a peripheral circuit of the display panel, and at least one through hole is further disposed in a position where no peripheral circuit is disposed in the non-display area;
a metal layer which is disposed in a position where the through hole is disposed, wherein the through hole passes through the metal layer.

16. The manufacturing method of claim 15, wherein the through holes are formed by means of laser drilling.

17. The manufacturing method of claim 16, further comprising forming a metal layer at a position in the display panel where the laser drilling is to be performed.

18. The display panel of claim 1, wherein a size of the through hole is equal to that of the pixel area.

* * * * *